US007703059B2

United States Patent
Murray et al.

(10) Patent No.: US 7,703,059 B2
(45) Date of Patent: Apr. 20, 2010

(54) METHOD AND APPARATUS FOR AUTOMATIC CREATION AND PLACEMENT OF A FLOOR-PLAN REGION

(75) Inventors: Daniel J. Murray, Rochester, MN (US); Jonathan W. Byrn, Kasson, MN (US)

(73) Assignee: LSI Corporation, Milpitas, CA (US)

( * ) Notice: Subject to any disclaimer, the term of this patent is extended or adjusted under 35 U.S.C. 154(b) by 52 days.

(21) Appl. No.: 11/438,644

(22) Filed: May 22, 2006

(65) Prior Publication Data
US 2007/0271539 A1 Nov. 22, 2007

(51) Int. Cl.
*G06F 17/50* (2006.01)

(52) U.S. Cl. .............................................. 716/7; 716/2
(58) Field of Classification Search ................ 716/1–21
See application file for complete search history.

(56) References Cited

U.S. PATENT DOCUMENTS

| | | | |
|---|---|---|---|
| 6,405,354 B1* | 6/2002 | Itazu et al. | 716/8 |
| 2001/0003843 A1* | 6/2001 | Scepanovic et al. | 716/7 |
| 2003/0046646 A1* | 3/2003 | Amano et al. | 716/9 |
| 2006/0225016 A1* | 10/2006 | Fukasawa | 716/10 |

* cited by examiner

Primary Examiner—Vuthe Siek
Assistant Examiner—Aric Lin
(74) Attorney, Agent, or Firm—Suiter Swantz pc llo

(57) ABSTRACT

A method and apparatus for floor-plan region creation and placement is provided. Design information may be received. Module area may be estimated for each module in an integrated circuit. Individual module may be selected for regioning, and region size and dimensions for module may be determined. Region parameters may be adjusted prior to final placement and placement may be verified.

10 Claims, 8 Drawing Sheets

METHOD AND APPARATUS FOR AUTOMATIC CREATION AND PLACEMENT OF A FLOOR-PLAN REGION

FIELD OF THE INVENTION

The present invention generally relates to the field of integrated circuits, and more particularly to a system and method for automatic creation and placement of a floor-plan region.

BACKGROUND OF THE INVENTION

Integrated circuit design planning is typically accomplished utilizing a variety of design tools. These tools enhance the creation of a workable layout so that integrated circuits may be fabricated using semiconductor fabrication equipment and techniques. One type of integrated circuit which requires a significant amount of labor in the development of a functional layout is the Application Specific Integrated Circuit or ASIC. ASICs are chips containing an array of hardware logic devices configured by a system designer to execute a certain function. One problem with the creation of such complex ASICs is the ability of the integrated circuit designer to determine the optimal location of components on the die for accomplishing desired performance goals.

The process of integrated circuit design, including ASIC design, usually consists of the design and logical layout of an integrated circuit followed by physical design, or the creation and proper placement of a routable circuit. Creation generally consists of the positioning of the various components of a circuit design according to the desired performance goals within a confined area of a die layout, usually referred to as a "floor-plan". For example, the circuit may be created from register transfer level (RTL) code and positioned on they die to meet the objectives of the design RTL code. A floor-plan is typically created by a design tool known as a planner. The floor-planning stage generally consists of defining the size of the integrated circuit, developing I/O pad locations, and creating groups and regions.

Placement generally consists of the placing cells in desired locations. Placement may be conducted by a design tool commonly referred to as a "placer". Properly placed designs are those that meet the design rules of the target silicon technology and are routable by a detailed router. Typical placement methods for achieving this goal include generating one or more initial placements and modifying the placement or placements using optimization methodologies such as simulated annealing, genetic algorithms (i.e. simulated evolution), and force directed placement. Each of these techniques involves iterative applications of the respective algorithms to arrive at an estimate of the optimal arrangement of the cells. Errors in this stage often manifest themselves as problems such as timing violations, placement congestion, or routing congestion later in the physical design process. An incorrect placement of certain fixed cells such as mega cells or I/O cells can spatially constrain placement of non-fixed cells such as logic cells or flip-flop cells. This may result in the placement of non-fixed cells into sub-optimal locations, reducing performance capabilities and functionality.

Physical design has been accomplished if a circuit achieves the performance goals of a design. If a design fails to meet performance goals, such as realistic timing objectives, a timing closure problem arises. Timing closure is generally known in the art as the breakdown in the predictable timing relationship between logical and physical design. A physical designer must often resolve timing closure by utilizing various optimization tools and manually adjusting the layout until timing issues may be resolved. Timing closure is especially problematic for ASIC performance oriented designs because circuit delays in the deep submicron (DSM) arena are dominated by net delays, and influenced primarily by cell placement. Further, traditional methods for estimating interconnect delay during physical design, such as fan-out based wireload modeling, are highly inaccurate at DSM levels, creating timing unpredictability between post design and post layout results.

When physical design tools cannot automatically resolve timing closure failure on a design, a physical designer may examine the placement generated by a design tool and recognize that the timing can be closed on the design if certain design portions are clustered in a particular location on the die. The designer may then utilize a variety of floor-planning tools to create a region for a module in the design and place the region. Typically, a physical designer must manually determine appropriate area, dimensions and placement of the region. For example, a designer must determine physical area allocable to each synthesizable module in a design, the physical location of each synthesizable module, physical locations of RAM, ROM, IP and other non-synthesizable blocks in the design and I/O pad locations. These initial design parameters are generally either rough estimates, or may be determined through detailed analysis of the design, which can often be time consuming.

Another disadvantage to known creation and placement techniques is that several iterations are usually required to obtain correct region area. Specifically, ensuring that region dimensions and placement are compatible with platform-based or standard cell ASICs may require multiple iterations through physical synthesis. It is often the case that several iterations are necessary to achieve performance goals, particularly in instances where performance goals are rigorous, or if they are subject to rigid time constraints. These iterations may be additional passes through the process by which design tools create a properly placed and routable circuit, generally referred to as physical synthesis. Multiple passes through physical synthesis are generally necessary to determine region utilization. A region's area may then be modified based on the utilization information obtained by physical synthesis. Region area modification, however, often requires a designer to reconstruct a floor-plan and repeat the process of physical synthesis until an acceptable chip is produced. As a result, the manual floor planning and cell placement optimization process requires an inordinate amount of time because the process requires manual iteration between running floor-plan tools and placement tools. Also, the time and effort required increases as design size increases, further frustrating region creation and refinement. For many designs, multiple iterations can be very resource consuming as well, making chip design undesirably expensive.

Therefore, it would be desirable to provide a method and apparatus for automatic creation and placement of a floor-plan region.

SUMMARY OF THE INVENTION

Accordingly, the present invention is directed to a novel method and apparatus for automatic creation and placement of a floor-plan region. In a first aspect of the present invention, the method may calculate an area estimate for each module in a design. The method may select a design module for which a region may be created and placed. The method may determine region size for module selection. The method may determine module connectivity information and utilize module connectivity information to select an initial placement coordinate for a module. The method may also provide region adjustment information including utilization adjustment, dimension adjustment and overlap prevention for a region.

In accordance with an additional aspect of the present invention an apparatus for automatic floor-plan region creation and placement is provided. In an embodiment of the invention, apparatus may be a computer-aided design tool such as a region placer configured to execute region creation and placement method in accordance with the present invention. Design tool may receive inputs including a region size and an initial placement coordinate, and place a region at the initial placement coordinate. Design tool may calculate region size from inputs including a module selection, a module selection area estimate and desired initial utilization value. Design tool may also provide region adjustment including utilization adjustment, dimension adjustment and overlap prevention for a region.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description serve to explain the principles of the invention.

BRIEF DESCRIPTION OF DRAWINGS

The numerous advantages of the present invention may be better understood by those skilled in the art by reference to the accompanying figures in which.

DETAILED DESCRIPTION

The present invention provides a method and apparatus for automatic floor-plan region creation and placement. Reference will now be made in detail to the presently preferred embodiments of the invention, examples of which are illustrated in the accompanying drawings.

Figure 1:
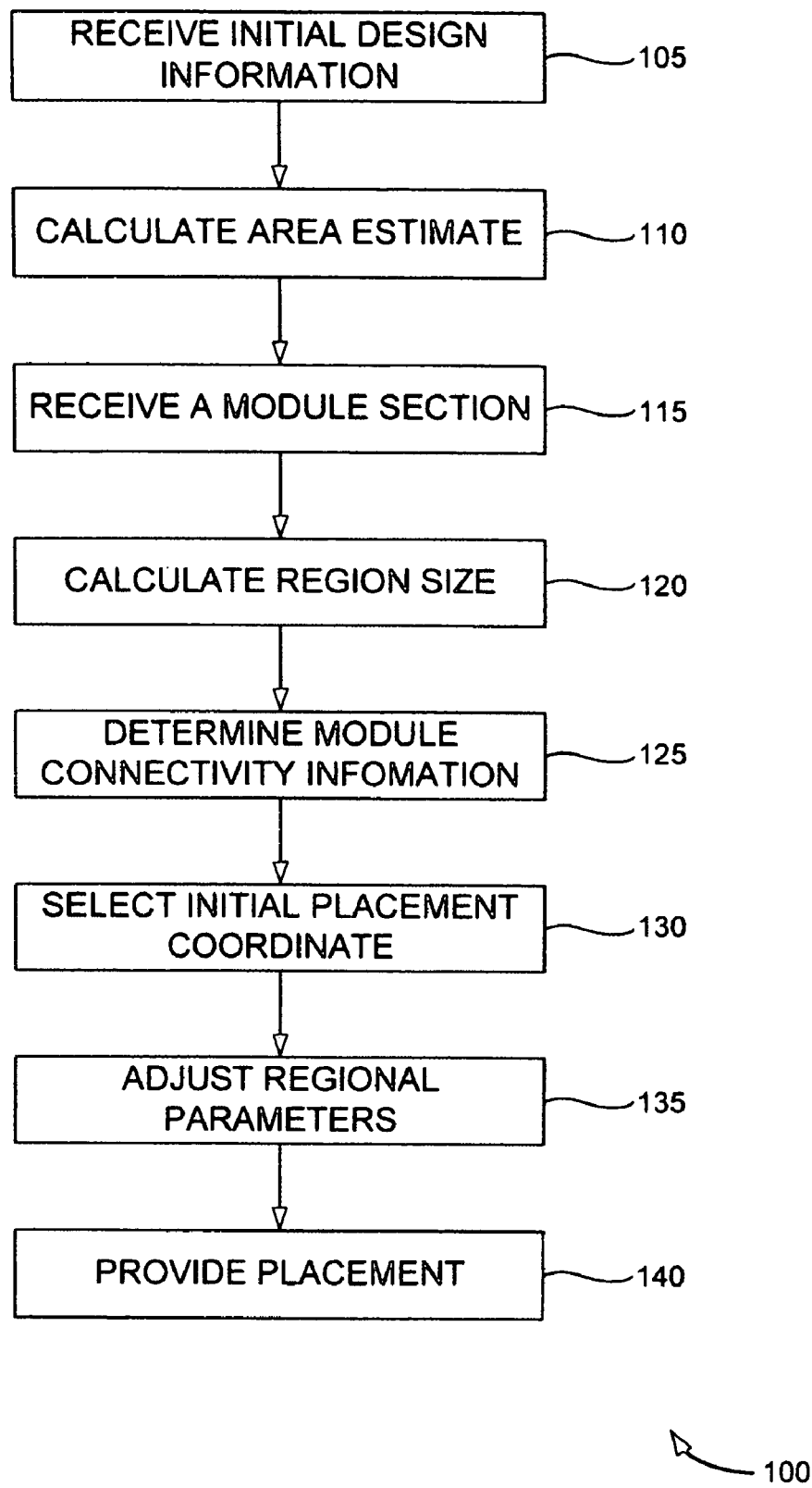
FIG. 1 depicts a flowchart representing a method for creating a floor-plan region in accordance with an exemplary embodiment of the present invention.

Referring to FIG. 1, a flowchart representing a method 100 for creating a floor-plan region in accordance with an exemplary embodiment of the present invention is shown. Method 100 may be implemented with any integrated circuit containing modules. Computer-aided design techniques may not be suitable for laying out an entire chip circuit design due to limitations on available memory space and computation power. A circuit design may therefore be partitioned into modules or subcircuits suitable for placement on a circuit platform. A module may be a collection of subcomponents comprising a circuit chip. For example a module may be a collection of fixed or non-fixed cells such as I/O cells, mega cells, flip-flop cells, logic cells and the like. The partitioning process may consider several factors, such as the number and size of modules, and the number of interconnections between the modules when partitioning a circuit. A portion of the die including only the custom-independent layers may be referred to as a slice. In general, a slice is a single die with one or more prefabricated layers. The slice may be pre-fabricated as an intermediate product. Alternatively, a slice may refer to a portion of a design of the die that is fixed, whether or not the slice may be pre-fabricated as an intermediate product.

Method 100 may receive initial design information 105, including the number and type of modules comprising an integrated circuit and module connectivity information, and calculate an area estimate for each circuit module 110 in an integrated chip design from received design information. The area of fixed cells or blockages inside a module may not be included in the area estimate for the module. Method 100 may be further comprised of receiving a module selection for region creation 115. A module for which a region may be created may be selected by a designer or may be automatically selected. Method 100 may calculate a region size 120 for module selection. Method 100 may utilize the area estimate calculated for the received module selection and a desired initial utilization value to calculate region size. Method 100 may determine module connectivity information 125 for selected module and select an initial placement coordinate for a region 130. Method 100 may utilize module connectivity information to select an initial placement coordinate for a region. For example, method 100 may determine initial region placement coordinate from connectivity information inputs including connectivity of the periphery of a module for which a region is being created, and connectivity to pre-placed objects inside a module selection. Additionally, a region may not encapsulate fixed cells, but may be placed near fixed cells. Method 100 may adjust region parameters 135 after initial placement. Adjustment of region parameters may be required for module to fit the context in the vicinity of the placement point. Region parameters suitable for adjustment may include region dimensions, region area, region shape and region utilization requirements. After adjustment of region parameters, method 100 may provide placement of a legalized region 140.

Initial design information may be received from design RTL code, a netlist or other such design instructions created after a floor-plan design is analyzed and completed. A netlist is typically a list of individual circuit components with a description of the connections between their inputs and outputs, such as logic gates and their interconnections. For example, the provision of an initial floor-plan design may include determining net physical layout, calculating the widths of the wires making up its power and ground nets, and determining slot spread in the wires to satisfy IC fabrication requirements.

Figure 2:
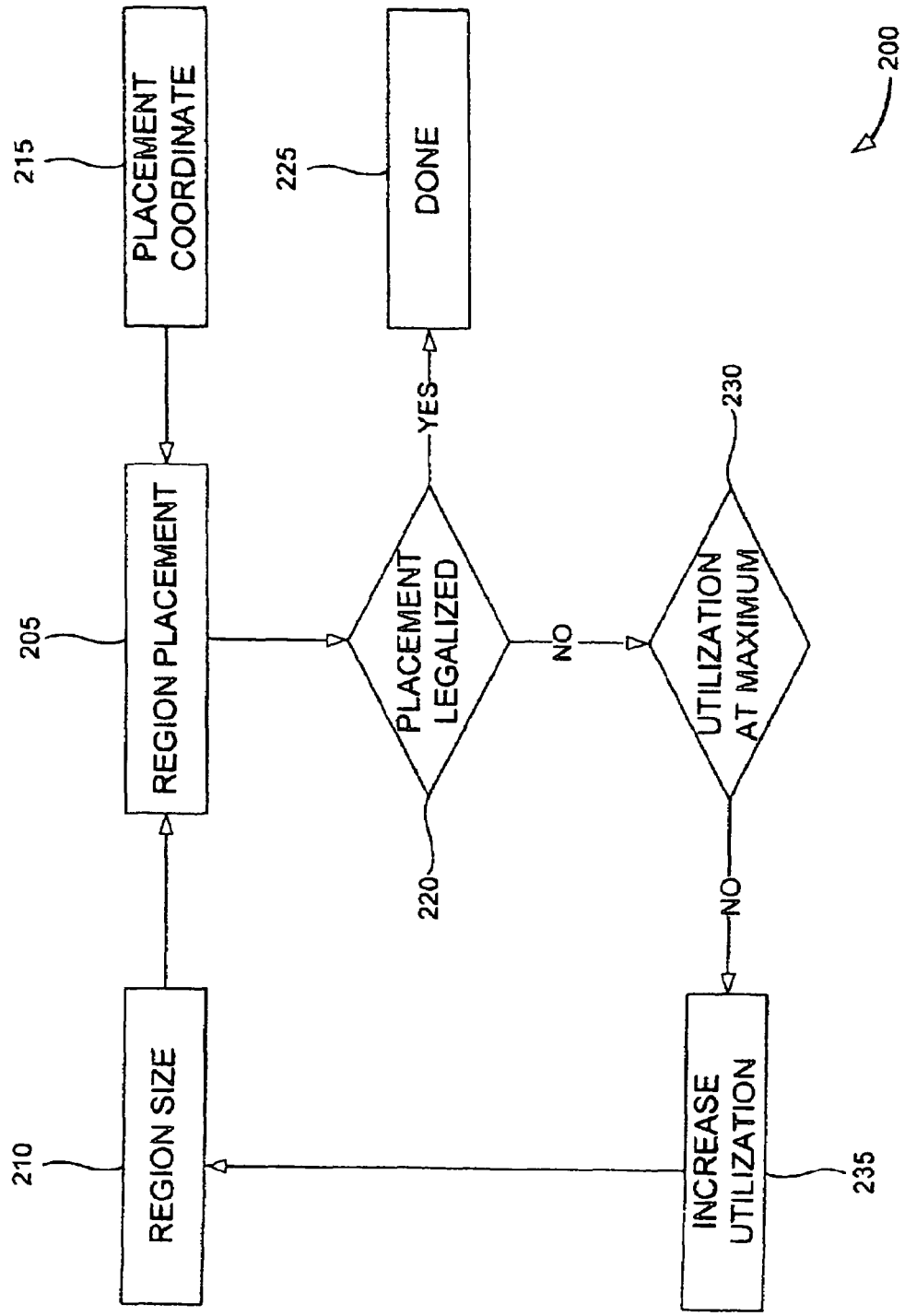
FIG. 2 depicts a block diagram of a method for utilization adjustment for a floor-plan region in accordance with an exemplary embodiment of the present invention.

A method in accordance with the present invention may provide region parameter adjustment for a module selection including region utilization adjustment. Utilization is generally known as the ratio of design functionality to module area. In integrated circuit design, it is desirable to achieve utilization optimization, or provide maximum functionality within a minimum module area. Referring to FIG. 2, a block diagram representing a sub-process 200 of method 100 for providing region utilization adjustment in accordance with an exemplary embodiment of the present invention is shown. Sub-process 200 may automatically adjust utilization values for optimization. Specifically, sub-process 200 may modify initial utilization value if utilization is not a maximum threshold value and placement has not been legalized. Sub-process 200 may begin by making an initial region placement 205. Initial region placement may be determined by receiving one or inputs including region size 210 and placement coordinate 215 as determined by method 100. Sub-process 200 may determine if placement is legalized 220. If placement is legalized, sub-process 200 may be complete 225. Placement is considered legalized if no fixed cells occupy areas covered by blockages, no fixed cells intersect, fixed mega cells are not moved, rotated or flipped, and sufficient space between fixed cells has been provided to create a legal placement of an entire chip. If placement is not legalized, a region utilization level may be determined 230. If utilization is not at a maximum threshold value, utilization may be increased 235. To increase utilization, the method may automatically reduce the region size until the maximum utilization allowed by the platform is reached. Increased utilization value may be included in new region size determination. Sub-process 200 may be repeated until placement is legalized.

Utilization value may be modified until maximum utilization threshold has been realized. Modified utilization value may be included in region size calculation for new region placement determination. Advantageously, a method in accordance with the present invention may create a region whose utilization initially matches a platform's utilization. This may prevent created regions from being utilized more heavily than other die elements. The method may include a minimum utilization threshold for designs that are small relative to a platform. Further, the method may automatically adjust utilization to achieve an optimal fit for a platform.

Figure 3:
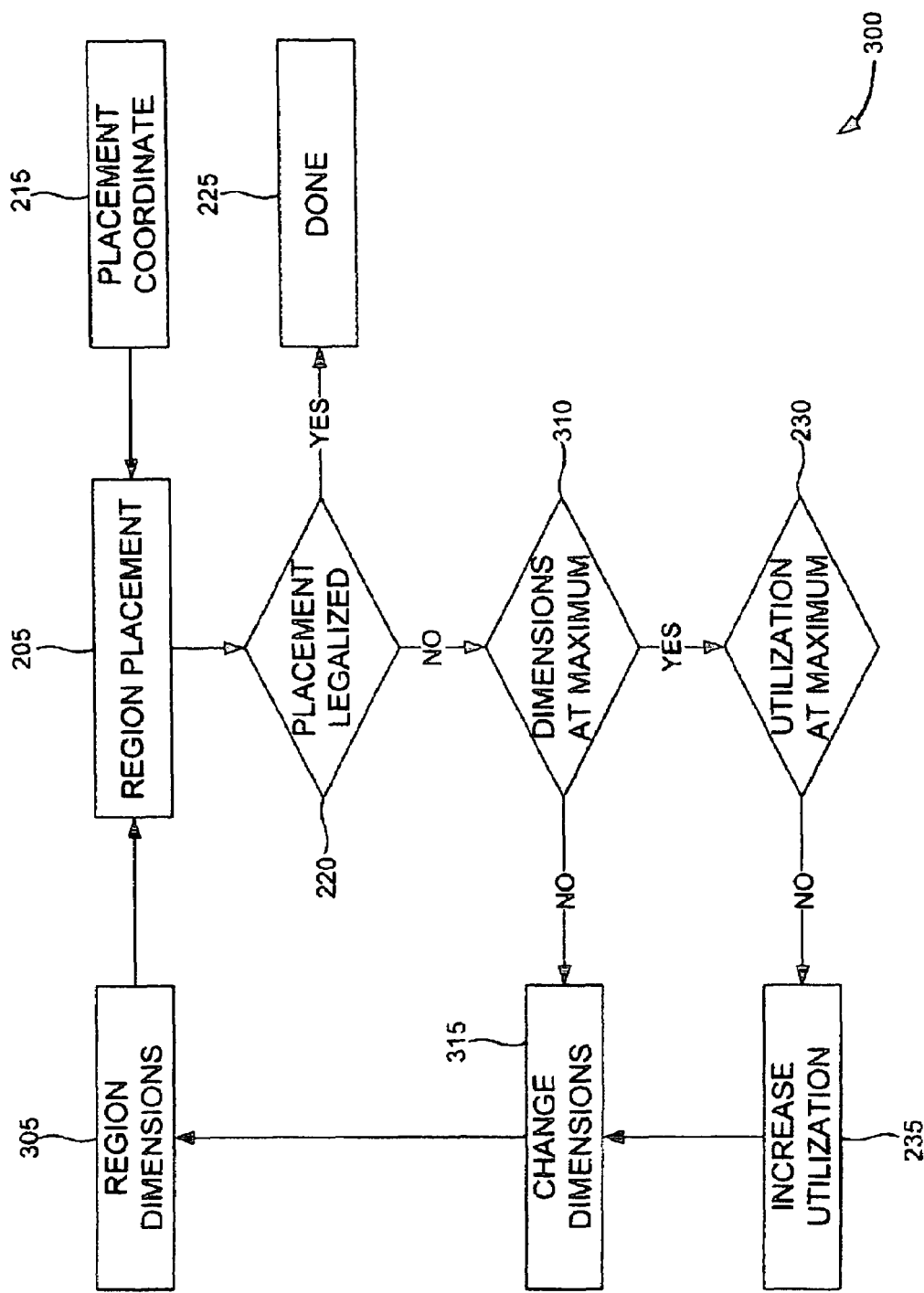
FIG. 3 depicts a block diagram of utilization and dimension adjustment for a floor-plan region in accordance with an exemplary embodiment of the present invention.

Referring to FIG. 3, a block diagram representing a sub-process 300 of method 100 for providing region dimension adjustment in accordance with an embodiment of the present invention is shown. It is contemplated that module utilization may reach a maximum threshold value, and may not be increased further. However, if utilization is at a determined maximum value, such maximum value being less than the desired utilization maximum value, region dimensions may be adjusted to allow for an increase in utilization maximum value. Sub-process 300 for region dimension adjustment may make an initial region placement 205. Initial region placement may be determined by receiving inputs such as initial region dimensions 305 and initial placement coordinate 215. Sub-process 300 may determine if placement is legalized 220. If placement is legalized, sub-process may be complete 225. If placement is not legalized, sub-process 300 may determine if region dimensions are at a maximum value 310. If dimensions have not reached a maximum allowed value for a defined region, region dimensions may be adjusted 315. Adjusted dimensions may be included in new region dimension determination. Sub-process 300 may then attempt to achieve legalized placement after each region dimension modification by iterating the placement steps of sub-process 300. For example, modified region dimension information may be received for new region placement determination. Sub-process 300 may be repeated until region dimensions have reached a maximum threshold value. If region dimensions have reached a maximum value, sub-process 300 may then attempt to achieve legalized placement by iterating the steps of sub-process 200. For example, if placement cannot be legalized by region dimension modification, a utilization level may be determined 230. If utilization level is not at a maximum level, utilization may be increased 235, region dimensions may be modified 315, and region dimensions 305 may be recalculated for determining region placement until placement has been legalized. It is further contemplated that if placement after legalization exceeds a distance threshold that is a percentage of the platform dimensions, or fails, the method will attempt to adjust the utilization to legalize the region placement.

Figure 4:
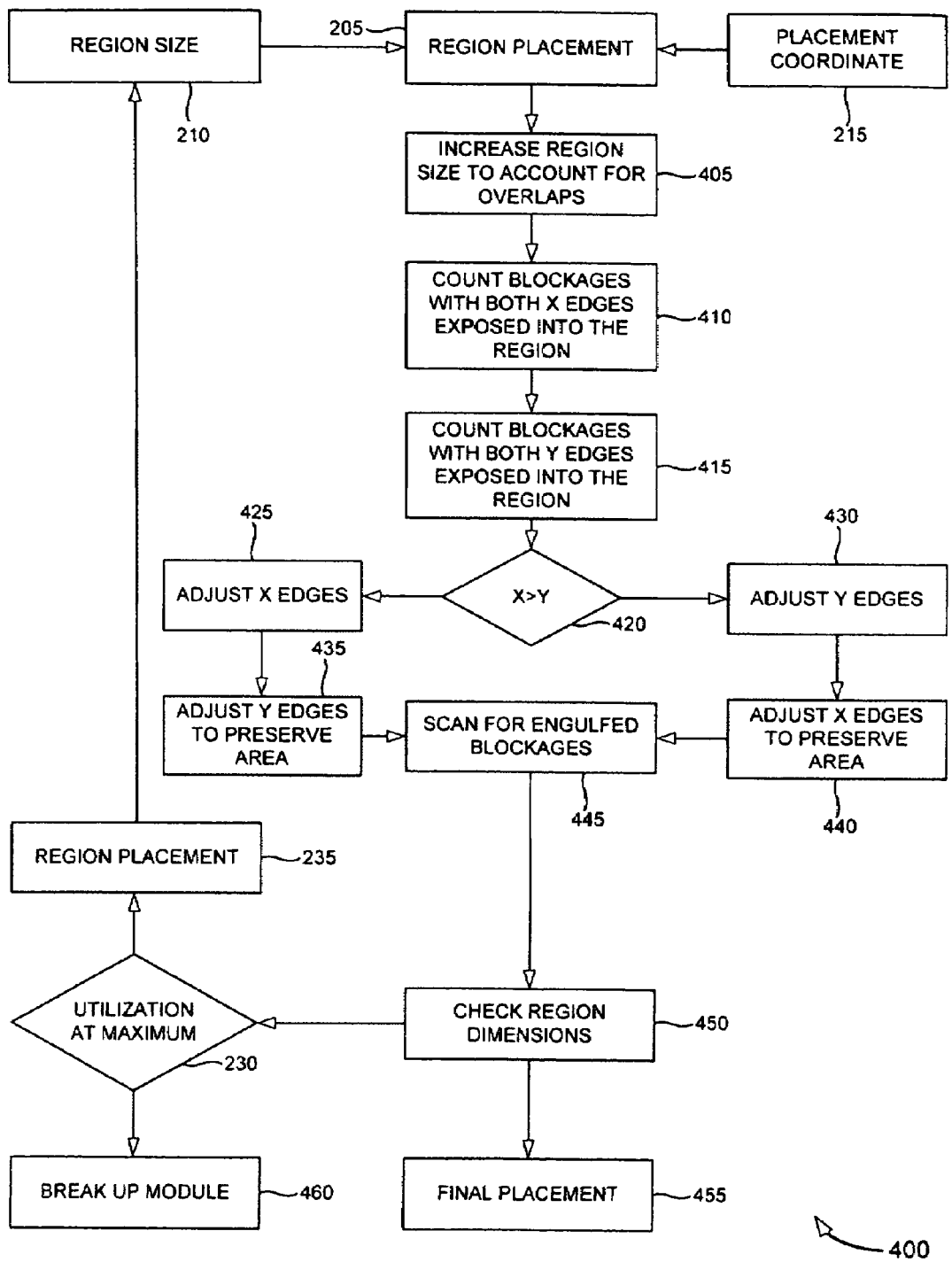
FIG. 4 depicts a block diagram of a method for overlap prevention for a floor-plan region in accordance with exemplary embodiment of the present invention.

Method 100 may further adjust region dimensions to prevent exposure of fixed cells into a region, while maintaining an overall region area equivalent to desired region size. Referring to FIG. 4, a block diagram representing a sub-process 400 of method 100 for providing overlap prevention in accordance with an embodiment of the present invention is shown. It is contemplated that utilization level and dimensions may be at maximum allowed values. If so, sub-process 400 may provide placement of a region at a desired placement coordinate regardless of legalization. Similar to sub-processes 200 and 300, sub-process 400 may determine initial region placement 205 by receiving inputs such as region size 210 and initial placement coordinate 215. In a preferred embodiment, sub-process 400 may provide placement of a region that may be the maximum size region suitable for placement at a given placement point. It is contemplated, however, that initial region placement may contain overlaps. Overlaps generally refer to region areas in which horizontal and vertical fixed cell edges or blockage edges may be exposed. Blockages may refer to fragments of a chip where cells may not be placed. Fixed cells may refer to cells such as mega cells, or cells substantially larger than regular cells having a subset of metal layers fully blocked, having zero porosity, at the respective design level. Sub-process may be further comprised of increasing region size to prevent overlaps with blockages or fixed cells having edges exposed into the region 405.

Sub-process 400 may then count the number of blockages or fixed cells with one or more horizontal edge components exposed into a region 410. Similarly, sub-process 400 may also count the number of fixed cells or blockages with one or more vertical edge components exposed into a region 415. Sub-process 400 may then determine if a region contains more of either horizontal or vertical edge components of blockages or fixed cells exposed into a region 420. If the number of blockages or fixed cells having both horizontal edges exposed into a region is greater than the number of blockages or fixed cells having both vertical edges exposed into a region, one or more of a region's horizontal dimension components may be adjusted to reduce or substantially eliminate blockage or fixed cell horizontal edge exposure into the region 425. Likewise, if the number of blockages or fixed cells having both vertical edges exposed into a region is greater than the number of blockages or fixed cells having both horizontal edges exposed into a region, one or more of a region's vertical dimension components may be adjusted to reduce or substantially eliminate blockage or fixed cell vertical edge exposure into a region 430. Once either one or more horizontal or vertical dimension components have been adjusted, an opposite dimension may be adjusted to return the effective area of a region to its original area. For example, if one or more of a region's horizontal dimension components are adjusted to prevent overlaps, one or more of a region's vertical dimension components may be adjusted to preserve region area 435. Alternatively, if one or more of a region's vertical dimension components are adjusted to prevent overlaps, one or more of a region's horizontal dimension components may be adjusted to preserve region area 440.

After a region's horizontal and vertical dimension components are adjusted, a region may be scanned to determine if overlaps or engulfed blockages exist in the region 445. Region may also be analyzed to determine if region dimensions have exceeded a maximum horizontal and vertical dimension component ratio 450. If blockage or fixed cell horizontal or vertical edge exposure into a region is detected, or if region dimensions have exceeded a maximum horizontal and vertical dimension component ratio, sub-process 400 for blockage or fixed cell exposure reduction or elimination may be repeated, including iterating the steps of sub-processes 200 and 300. For example, a utilization level may be determined 230, and if utilization is not a maximum level for a region, utilization may be increased 235. A larger utilization number may be used for subsequent iterations of sub-process 400 if any blockage or fixed cell has both horizontal and vertical edges exposed into the region, or if region dimensions have exceeded a maximum horizontal and vertical dimension component ratio. Legalized placement 455 may be accomplished when no blockages or fixed cells are engulfed by a region and the region's horizontal to vertical dimension component ration has not been exceed.

If a placement cannot be located where no placement blockages or fixed cells are engulfed, a region's horizontal to vertical dimension component ratio has been exceeded, and region utilization is at a maximum allowed value, module may be subdivided into smaller modules 460. This may be accomplished by cones of logic being traced from input pins of the module, and placed into separate smaller modules. The system may then determine proper physical locations better placement and timing for smaller modules by iterating region creation and placement method 100, including sub-processes 200-400 for all modules instantiated in a current module.

Figure 5A:
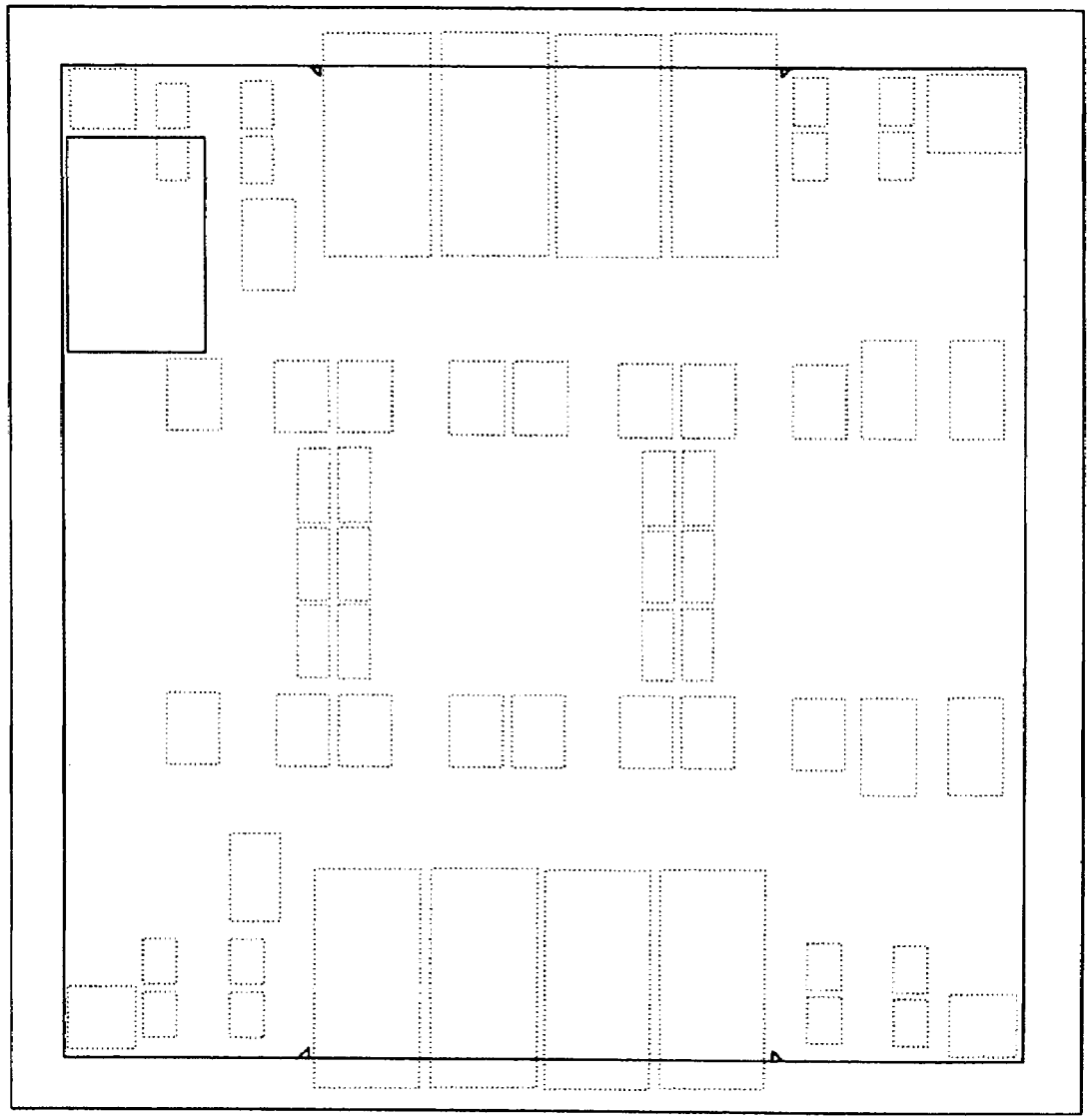
FIG. 5A depicts an illustration representing initial placement of a region on a platform in accordance with an exemplary embodiment of the present invention.
Figure 5B:
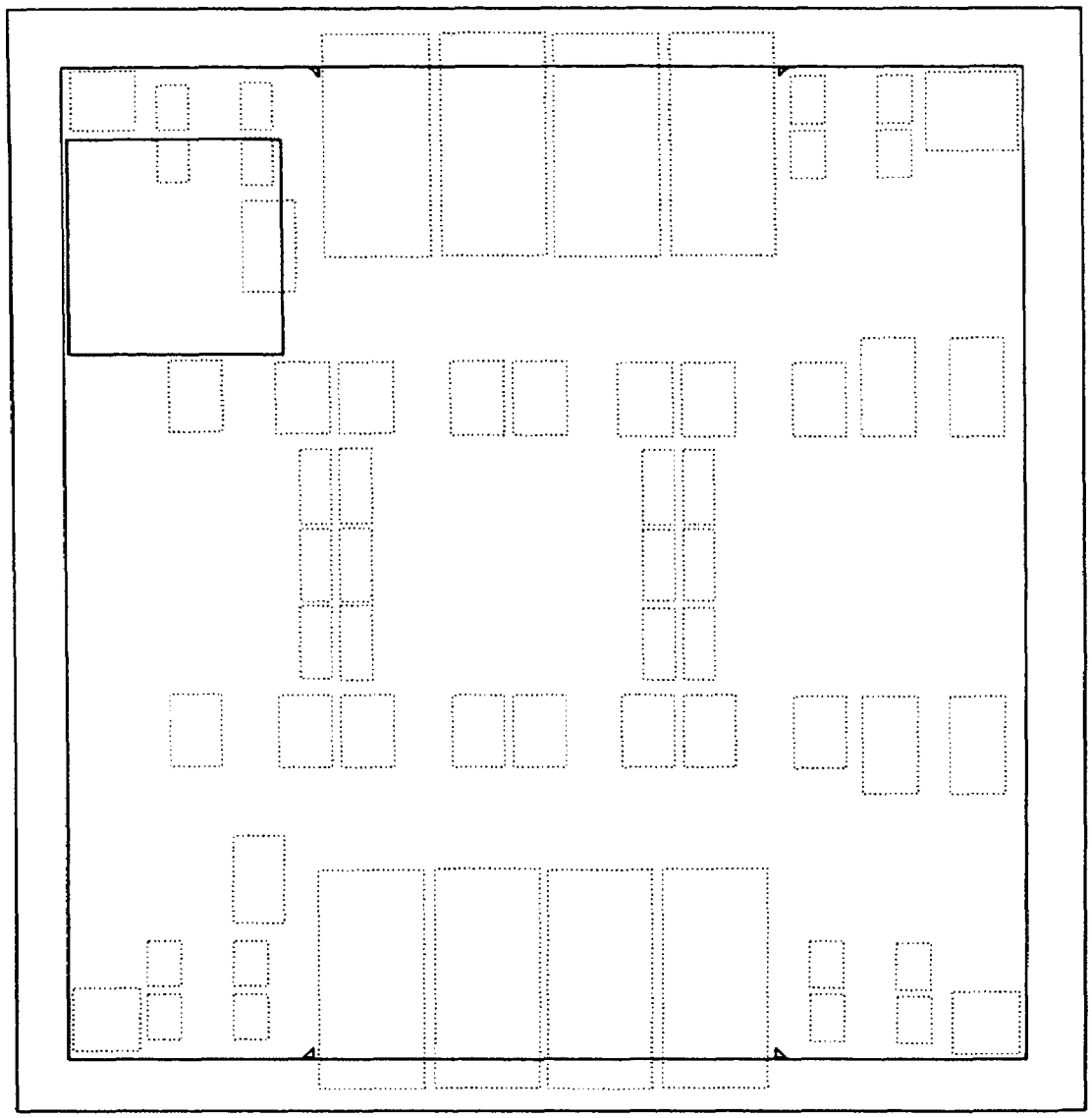
FIG. 5B depicts an illustration representing region size adjustment to account for overlapping blockages.
Figure 5C:
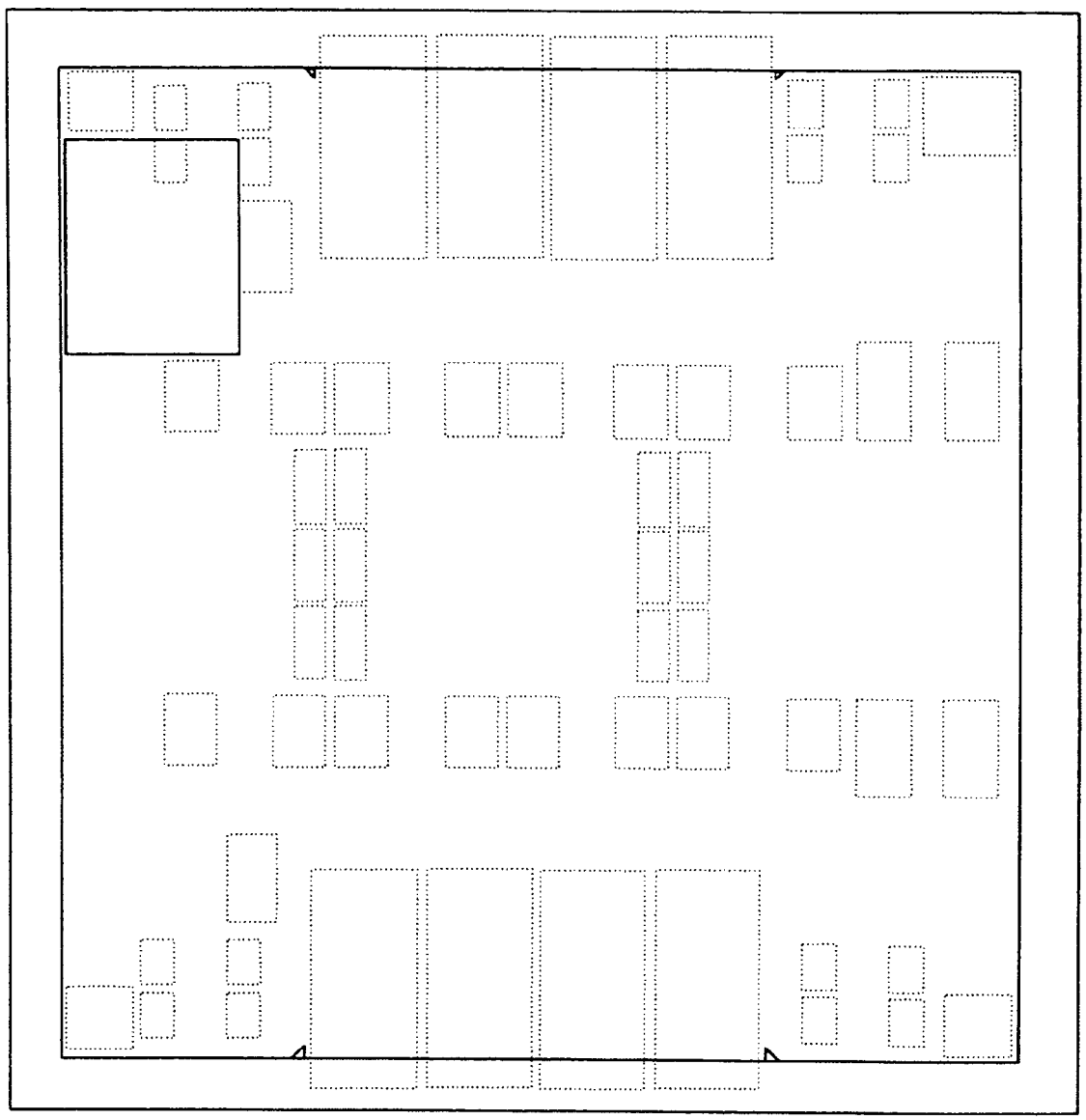
FIG. 5C depicts an illustration representing horizontal dimension component adjustment of a region in accordance with an exemplary embodiment of the present invention.
Figure 5D:
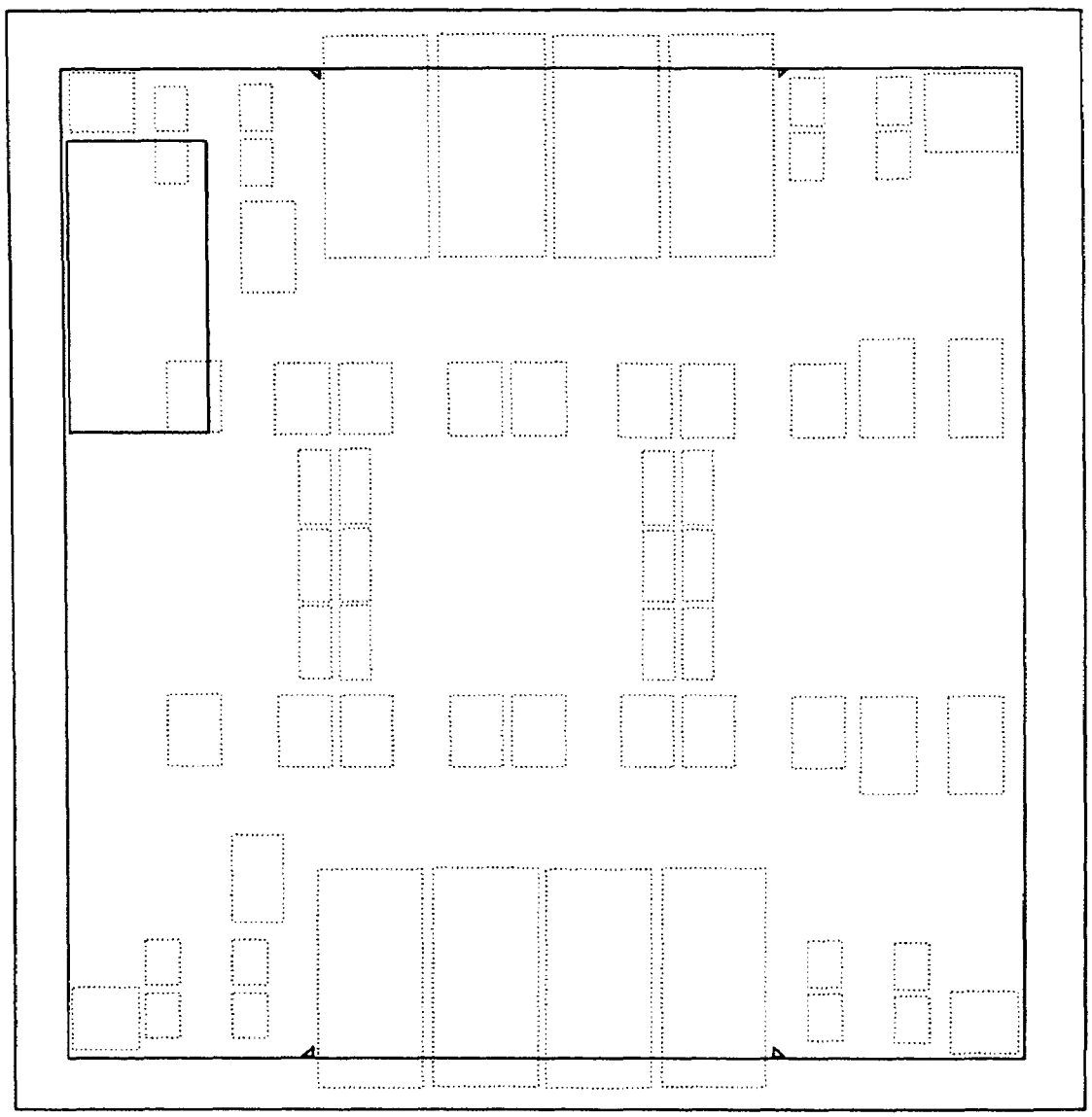
FIG. 5D depicts an illustration representing vertical dimension component adjustment of a region in accordance with an exemplary embodiment of the present invention.

Referring to FIGS. 5A-D, illustrations representing initial placement of a region 500 on a platform and region dimension adjustment in accordance with an exemplary embodiment of the present invention are shown. Initial region dimensions may be equal, creating an initial region that is substantially square, as depicted in FIG. 5A. In an alternative embodiment, an initial region may be substantially rectangular. Region dimensions may be comprised of at least two substantially horizontal dimension components and at least two substantially vertical components. A first adjustment may be made to region size to account for overlapping blockages, as shown in FIG. 5B. In the present example, a greater number of blockages or fixed cells have both horizontal edges exposed into the region. As depicted in FIG. 5C, horizontal dimension components of a region may be modified, to adjust the horizontal edge of region to avoid any blockage or fixed cell having both horizontal edges exposed into the region. To preserve region area at a desired value, method 100 may automatically decrease one or more vertical dimension components, as shown in FIG. 5D. Horizontal and vertical dimension components may be adjusted, however, horizontal and vertical dimension component ratio may not exceed a maximum value desired by a user. As such, region dimension adjustment may be limited by a maximum horizontal dimension component to vertical dimension component ratio for a platform. Ratio may be modified by user to accommodate alterations in design parameters.

Method 100 may also attempt to legalize the placement of each resized area while maintaining the first resized region that may be legally placed. Additionally, if a legal placement was found for the region that was shaped as both a horizontal region and a vertical region, the region that is closest to square may be kept. Alternatively, a user may select a desired region shape from a set of one or more legally placed region shapes for a module. If no legal placements are found for the rectangular regions, region utilization may be automatically increased in steps until maximum utilization is reached. The process of adjusting region dimensions may be attempted each time utilization is increased.

In a preferred embodiment, the method and apparatus of the present invention may be implemented with a platform-based ASIC design. A platform-based ASIC reduces manufacture cycle time and design cycle time by tightly defining silicon, IP and design methodology together to minimize development costs for complex systems. Platform-based ASICs typically consist of a collection of slices having varying gate ranges, memory, I/O, PLLs and other such IP such as high speed Serializer/Deserializers. Each platform-based ASIC slice may be pre-manufactured and may include pre-defined metal layers and pre-characterization of chip components. For example, design differentiation and customization may be achieved by creating custom metal layers that create custom connections between predefined lower-layer logic elements. Advantageously, a platform ASIC slice may be customized through only a small number of metal layers, eliminating the need for full masking.

A platform-based ASIC design may utilize configurable transistor fabric such as R-Cell technology fabric, or a like fine grain fabric. R-Cells may be 5 transistor elements configured by metal and may be configured as gates, flip-flop or memory cells. IP may include diffused IP, hard IP, firm IP and soft IP. Diffused IP utilizes fixed diffusion and metallization using standard cell, custom, and/or mixed-signal logic. The location of diffused IP is generally fixed. Hard IP is IP with completed placement and routing utilizing architecture specific cells. Firm IP is typically delivered as a netlist including build deliverables such as timing constraints, synthesis scripts, and simulation models. Firm IP may contain a placement file and may be utilized when RTL code cannot be provided. Soft IP is IP delivered as RTL, including build deliverables and may be instantiated with a design.

In an alternative embodiment, the present invention may be implemented with standard cell based ASICs. For example, the invention may be suitable for cell based ASIC applications requiring logic integration above 5 million ASIC gates, higher than 300 MHz system performance, and lowest possible unit cost due to high volume projections. It is further contemplated that a method and apparatus in accordance with the present invention may be suitable for any integrated circuit creation applications, including, but not limited to, semi-custom design applications, full custom design applications, or applications combining any IC design applications.

In an exemplary embodiment of the present invention, the method 100 and sub-processes 200-400 disclosed may be implemented with a computer-aided design tool configured to execute the steps of the method 100. Design tool may be a region placer, and may receive initial design information for an integrated circuit. Design tool may also estimate an area for each of a plurality of modules within an integrated circuit. Design tool may select a module to region from the plurality of modules and calculate region dimensions for the module. Design tool may then select an initial region placement for a module to be regioned. Design tool may further provide region parameter adjustment for the region, and may verify placement legalization for the region. Upon verification of placement legalization for the region, design tool may place a legalized region for a selected module.

In further exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not meant to be limited to the specific order or hierarchy presented.

It is believed that the method and apparatus for automatically creating and placing a floor-plan region of the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A computer-readable medium having computer-executable instructions for performing a method for creating and placing a floor-plan region, said method comprising:
   receiving design information for an integrated circuit, said integrated circuit being comprised of a plurality of modules and said design
   information including connectivity information regarding said plurality of modules;
   calculating an area estimate for a module of said plurality of modules from said received design information, the area estimate excluding the area of a fixed cell or blockage within said module;
   selecting a module to place within a region suitable for encompassing said module;
   calculating region size for the region suitable for encompassing said module by utilizing said area estimate calculated for said module;
   determining region dimensions for said region;
   selecting an initial region placement by utilizing received connectivity information for said module, the initial region placement positioned in proximity to a fixed cell without encapsulating said fixed cell;
   providing region parameter adjustment, further including:
      determining a region utilization level;
      increasing the region utilization level to a maximum utilization level, further including:
         reducing said region dimensions until the maximum utilization level is reached;
         determining a number of blockages or fixed cells having one or more horizontal edge components exposed into a region;
         determining a number of blockages or fixed cells having one or more vertical edge components exposed into a region; and
         increasing at least one of a vertical dimension component or a horizontal dimension component of said region to exclude the blockages or fixed cells and decreasing the other of the at least one of a vertical dimension component or a horizontal dimension component to maintain the area of said region;
   scanning said region having said adjusted region parameters to detect a fixed cell horizontal or vertical edge exposure or a blockage present within said region; and,
   if a fixed cell horizontal or vertical edge exposure or a blockage is present within the region, increasing the region utilization level and reducing said region dimensions until the increased utilization level is reached;
   and
   providing placement of said region having said adjusted region parameters.

2. The method as claimed in claim 1, wherein said design information is received from design RTL code, a netlist, or design instructions.

3. The method as claimed in claim 1, wherein said region size is determined from inputs including said area estimate and a utilization value.

4. The method as claimed in claim 1, wherein said region dimensions include at least two adjustable horizontal dimension components and at least two adjustable vertical dimension components.

5. The method as claimed in claim 1, wherein said module connectivity information includes module periphery connectivity information and pre-placed object connectivity information.

6. The method as claimed in claim 1, wherein said region parameter adjustment includes at least one of utilization level adjustment, region dimension adjustment and overlap prevention adjustment.

7. A computer based design tool for creating and placing a floor-plan region, wherein said design tool is configured to:
   receive design information for an integrated circuit, said integrated circuit being comprised of a plurality of modules, and said design
   information including connectivity information regarding said plurality of modules;
   estimate an area for at least one of said plurality of modules, the area estimate excluding the area of a fixed cell or blockage within said module;
   select a module from said plurality of modules;
   calculate region dimensions for a region for said module;
   select initial region placement;
   provide region parameter adjustment including an adjustment of at least one of region dimensions, region area, region shape, or region utilization requirements, the region parameter adjustment being utilized for fitting the module to a context in a vicinity of a placement point, the region parameter adjustment further including:
      determining a region utilization level;
      increasing the region utilization level to a maximum utilization level, further including:
         reducing said region dimensions until the maximum utilization level is reached;
         determining a number of blockages or fixed cells having one or more horizontal edge components exposed into a region;
         determining a number of blockages or fixed cells having one or more vertical edge components exposed into a region; and
         increasing at least one of a vertical dimension component or a horizontal dimension component of said region to exclude the blockages or fixed cells and decreasing the other of the at least one of a vertical dimension component or a horizontal dimension component to maintain the area of said region;
      scanning said region having said adjusted region parameters to detect a fixed cell horizontal or vertical edge exposure or a blockage present within said region; and,
      if a fixed cell horizontal or vertical edge exposure or a blockage is present within the region, increasing the region utilization level and reducing said region dimensions until the increased utilization level is reached;

verify placement legalization; and place a region having said adjusted region parameters for said module.

8. The computer-based design tool as claimed in claim 7, wherein said design information is received from design RTL code, a netlist, or design instructions.

9. The computer-based design tool as claimed in claim 7, wherein said region dimensions are determined from inputs including said area estimate and a utilization value.

10. The computer-based design tool as claimed in claim 7, wherein said region dimensions include at least two adjustable horizontal dimension components and at least two adjustable vertical dimension components.

* * * * *